United States Patent [19]
Nelson

[11] Patent Number: 5,166,548
[45] Date of Patent: Nov. 24, 1992

[54] ZERO DIFFERENTIAL SWITCHING SYSTEM

[76] Inventor: Richard W. Nelson, 1365 Empire Ct., Freeport, Ill. 61032

[21] Appl. No.: 538,364

[22] Filed: Jun. 14, 1990

[51] Int. Cl.$^5$ .................. H03K 17/90; H03K 5/153; H03K 3/00; G06G 7/12
[52] U.S. Cl. .................. 307/309; 307/491; 307/494; 307/359; 307/278
[58] Field of Search .............. 307/309, 491, 494, 359, 307/278

[56] References Cited
U.S. PATENT DOCUMENTS
4,849,695 7/1989 Muller et al. .................. 307/309

Primary Examiner—Stanley D. Miller
Assistant Examiner—Trong Phan

[57] ABSTRACT

A Hall element switching system which provide clean switching and wherein the system operate and release points are the same. The system includes a Hall element, first and second comparator circuits and a feedback circuit. The Hall element is the sensing part of the system and produces a voltage output which is proportional to the strength of the magnetic field impinging thereon. The output of the Hall element controls the switching of the first and second comparator circuits. The second comparator circuit, in turn, controls the output of the feedback circuit. The feedback circuit output is connected to the input of the first comparator circuit and can be at one of three levels. The feedback circuit by being connected to the input of the first comparator circuit causes a shift in the operate and release points of the first comparator circuit. The output of the first comparator circuit is the system output. By appropriate choice of the feedback signal, the system will operate and release at the same magnetic field intensity of the Hall element. But because hysteresis remains in the operation of each comparator circuit, clean switching is provided.

8 Claims, 5 Drawing Sheets

PRIOR ART SYSTEM

ZERO DIFFERENTIAL SWITCHING SYSTEM

BACKGROUND OF THE INVENTION

This invention is directed toward the field of switching systems. More specifically, the invention is a switching system which has a zero differential between sensing circuit operate and release points.

Sensors, such as Hall elements, are often used to trigger a switching system. An example of a switching system is where a Hall element and a magnet are used to create a proximity switching system. When a magnet is placed in close proximity to a biased Hall element, a voltage difference between two sensing terminals of the Hall element is produced. The magnet may be mounted on an apparatus which periodically moves towards and away from the Hall element. This periodic movement of the magnet produces a periodic magnetic field intensity at the Hall element and consequently a periodic voltage difference between sense terminals of the Hall element. This Hall element output voltage bears a linear relationship with the intensity of the magnetic field.

Because the output voltage of the Hall element is related to the distance of the magnet from the Hall element, the Hall element-magnet apparatus may be used for proximity switching. Often a voltage comparator circuit includes a voltage comparator in which positive feedback is used to accomplish switching. The voltage comparator has inverting and noninverting input terminals and produces a high output if the voltage difference across the terminals is positive, and a low output if the voltage difference across the input terminals is negative. A comparator circuit which is made of a voltage comparator with a feedback path, produces the same digital output, but due to the feedback, the switch from a low to high output occurs at a preselected operating voltage ($V_{OP}$) and a switch from a high to a low output occurs at a different preselected release voltage $V_{RE}$. $V_{OP}$ is the voltage at the sensor terminals at which the voltage across the input terminals of the voltage comparator equals zero, when the output of the comparator circuit is at a low state. $V_{RE}$ is the voltage at the sensor terminals at which the voltage across the input terminals of the voltage comparator equals zero, when the output of the voltage comparator circuit is at a high state. The difference between $V_{OP}$ and $V_{RE}$ is known as the differential.

Since the output voltage of the Hall element is related to magnetic field intensity, it is also possible to talk about a $B_{OP}$ and a $B_{RE}$. $B_{OP}$ is the magnetic field intensity which causes the Hall element to produce a voltage of $V_{OP}$ across its terminals. $B_{RE}$ is the magnetic field intensity which causes the Hall element to produce a voltage of $V_{RE}$ across its terminals.

If an electromechanical pressure sensor were used, $P_{OP}$ would be the pressure at which the voltage across the sensor terminals is $V_{OP}$. Accordingly, $P_{RE}$ is the pressure at which the voltage across the sensor terminals is VRE.

Some switching systems are based on the flow of a fluid, such as hydraulic or pneumatic systems. In these systems, a valve operates as the equivalent of the voltage comparator. When a positive difference in pressure is present between first and second inlets, fluid flow through an outlet is enabled. When a negative pressure difference is present between the first and second inlets, fluid flow through the outlet is prevented. Feedback is possible here as well by allowing fluid flow between the outlet and one of the inlets. This produces a differential between operate and release points as well.

In some applications, it is desirable to have the switching apparatus "turn on" at the same sensor input level as the sensor input level at which it turns off, or in other words have a zero differential system. For a Hall element switching system this can be expressed as $B_{OP}=B_{RE}$. Yet, when a single comparator circuit has an operate point equal to its release point, (no hysteresis), the comparator circuit is unstable. The comparator circuit's output, when the operate point equals the release point, $V_{RE}$ may oscillate between high and low output levels when the input voltage is in the vicinity of the operate or release points. Therefore this cannot be a solution to the problem.

Thus it is the object of the present invention to provide a stable switching system where the operate point is the same as the release point and wherein the system does not oscillate between high and low outputs when $V_{OP}$ is near $V_{RE}$.

SUMMARY OF THE INVENTION

The present invention is a switching system which includes a second comparator circuit and a feedback circuit which causes the switching system output to change states from low to high at the same sensor input level as when the system output switches from high to low. Both comparator circuits have operate and release points where the operate point is greater than the release point. The feedback circuit generates a feedback signal which is a high, mid level or low signal. The feedback signal is sent to a noninverting terminal of a first comparator in the first comparator circuit. The condition of the feedback signal is controlled by the outputs of the first and second comparator circuits. The second comparator circuit shifts the operate and release points of the first comparator circuit by changing the feedback signal to the noninverting terminal of the first comparator, thus making the sensor input level operate point equal to the sensor input level release point while output oscillation is prevented because internal system hysteresis is created by the first comparator circuit.

BRIEF DESCRIPTION OF THE DRAWING

FIG. 1b shows graphically the varying magnetic field and the output voltage, $V_O$, of the system of FIG. 1a.

DESCRIPTION OF THE PREFERRED EMBODIMENT

The inventive switching system may be implemented in many ways including hydraulic, pneumatic or electrical systems. However, for ease of description, the invention will be described using an exemplary electrical system.

Figure 1A:
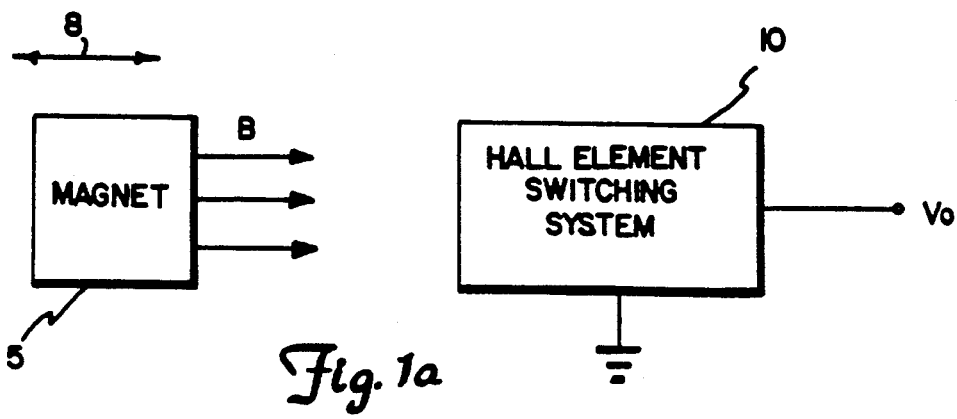
FIG. 1a shows a magnet and a Hall element switching system according to the present invention.
Figure 1B:
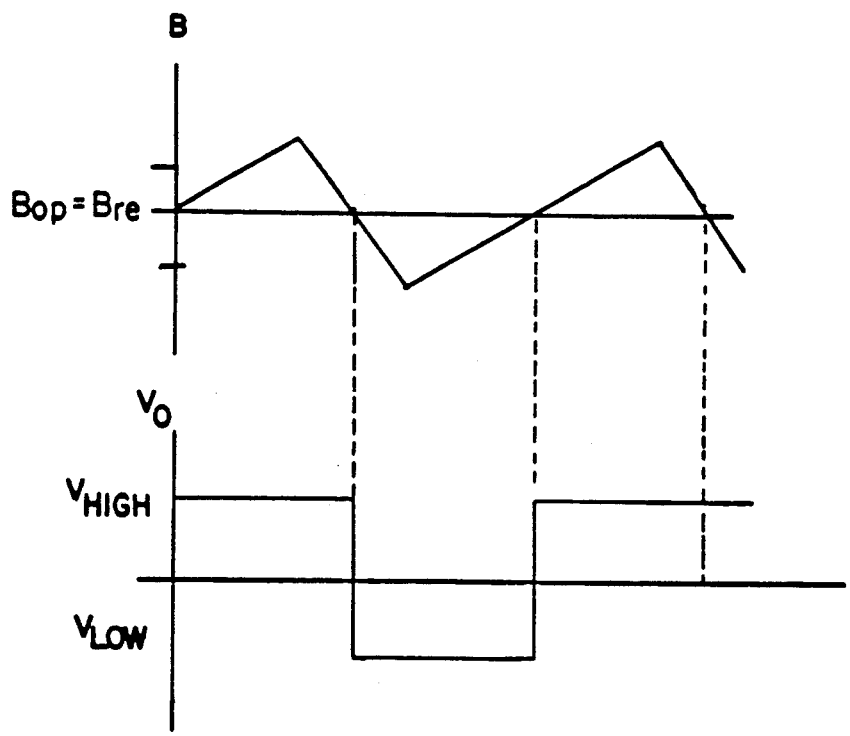

FIG. 1a depicts the Hall element switching system 10 representative of the present invention. Thereshown is a magnet 5 and the zero differential switching system 10 of the present invention. Magnet 5 produces a magnetic field B which affects the sensing system 10. The effect on switch system 10 can be varied by varying the magnetic field B. The magnetic field can be varied by moving the magnet 5, for example, in the two directions indicated by line 8. The switching system produces an output voltage $V_O$ which is high when the magnetic field impinging on the Hall element rises from less than to greater than $B_{OP}$ and low when the received magnetic field strength falls from greater than to less than $B_{RE}$. In the present invention, the switching system is designed so that $B_{OP}=B_{RE}$ thus causing the output to switch from $V_{Low}$ to $V_{High}$ at the same magnetic field intensity as a switch from $V_{High}$ to $V_{Low}$. The varying magnetic field and $V_O$ are represented in FIG. 1b.

Figure 2:
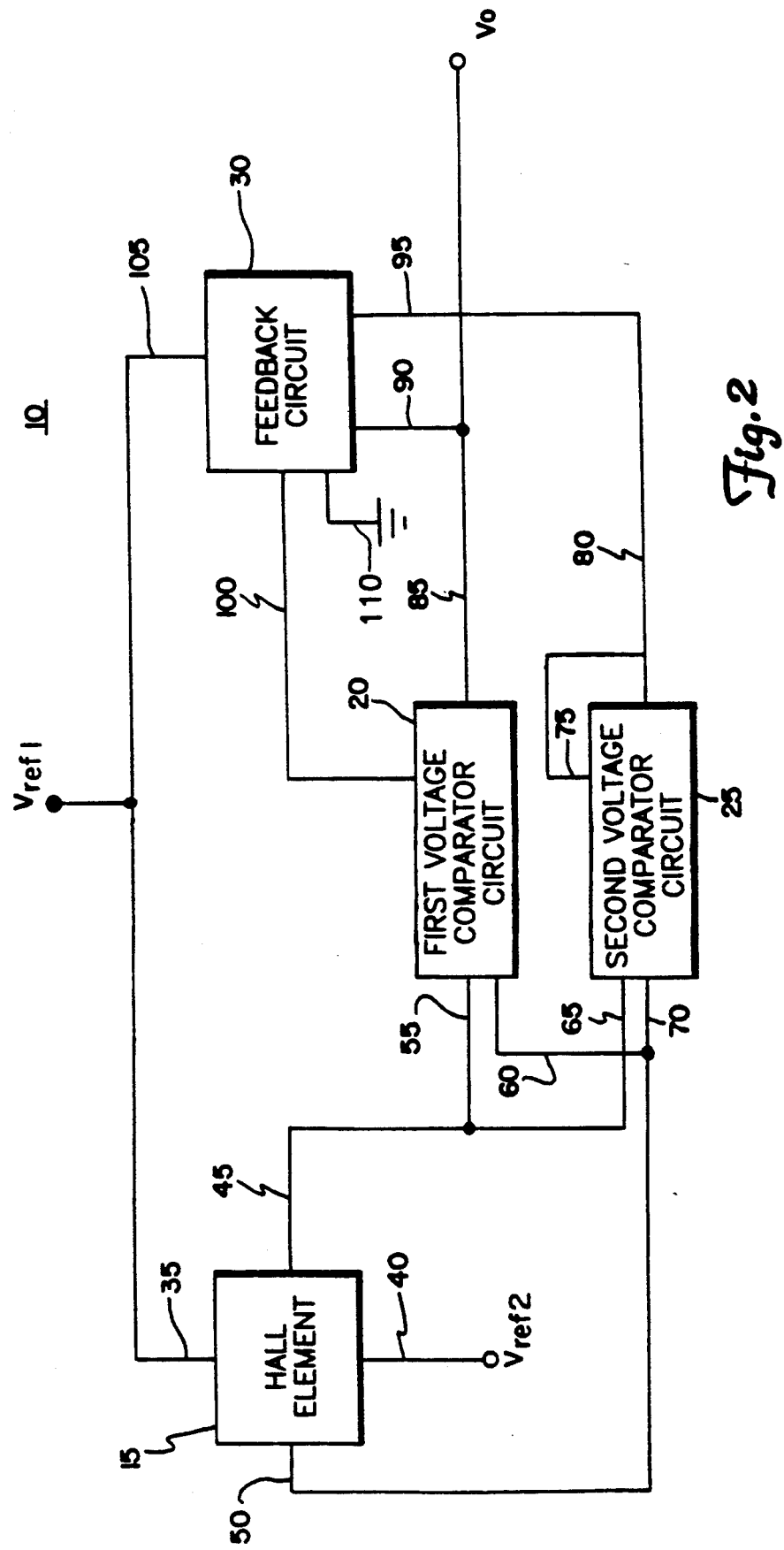
FIG. 2 is a system diagram of the present switching device.

In FIG. 2, a Hall element 15 is biased by connecting one supply terminal 35 to a reference voltage $V_{REF1}$ and the other supply terminal 40 to $V_{REF2}$. For this embodiment, $V_{REF2}$ will be at ground. When a magnet (not shown) is placed in proximity to the Hall element 15, a voltage difference is created between sense terminals 45 and 50.

The output voltage of the Hall element 15 is sensed by a first voltage comparator circuit 20 having input terminals 55 and 60 and a second voltage comparator circuit 25 having input terminals 65 and 70. The voltage comparator circuits each compare the voltage difference between the two input terminals and produce a first output if the voltage difference rises, from below to above $V_{OP}$ and a second output if the voltage difference between the two inputs falls, from above, to below $V_{RE}$. The operate voltages of the first and second comparators will be called $V_{OP1}$ and $V_{OP2}$ respectively while the release voltages will be called $V_{RE1}$ and $V_{RE2}$ respectively. For this embodiment the first output is equal to $V_{High}$ and the second output is equal to $V_{Low}$. The first output terminal 85 of the first voltage comparator circuit 20, is also the system output terminal having system output voltage $V_O$. $V_O$ is provided to feedback circuit 30 at first feedback terminal 9?. The output terminal 80 of second voltage comparator circuit 25 is electrically connected to feedback circuit 30 through second feedback terminal 95, as well as being electrically connected with the feedback terminal 75 of the second voltage comparator circuit 25.

Feedback circuit 30 is used to provide a selected feedback signal to the first voltage comparator circuit 20. By selecting an appropriate feedback signal, the differential between $B_{OP}$ and $B_{RE}$ of sensing system 10 is zero. In this embodiment, feedback circuit 30 is connected to $V_{REF1}$ at bias terminal 105 and to ground at bias terminal 110. The feedback signal is determined by the feedback circuit 30, and is in the form of a trinary code. There are three possible levels for the output of feedback circuit 30: a low potential output, a mid potential output and a high level potential output. The output of the feedback circuit is dependent upon the voltage levels at first feedback terminal 90 and second feedback circuit terminal 95, and consequently on the outputs of first and second voltage comparator circuits 20, 25. Feedback circuit 30 contains logic circuitry which produces the following output levels for the shown inputs.

| $V_O$ | $V_{C2}$ | Feedback Circuit Output |
|---|---|---|
| L | L | Mid |
| L | H | Low |
| H | L | High |
| H | H | Mid |

As can be seen, the feedback signal will be at the mid level if both inputs to the feedback circuit are at the same level. If the inputs differ, then the feedback signal will be at the same level as the output from the first comparator means 20. It is important to note that the magnetic field intensity must increase to a level where the Hall element 15 output voltage goes beyond $V_{OP1}$ to $V_{OP2}$ or down past $V_{RE1}$ to $V_{RE2}$ to return the feedback signal to the same state as the output signal. More explanation of the feedback circuits occurs later in this specification.

Figure 3:
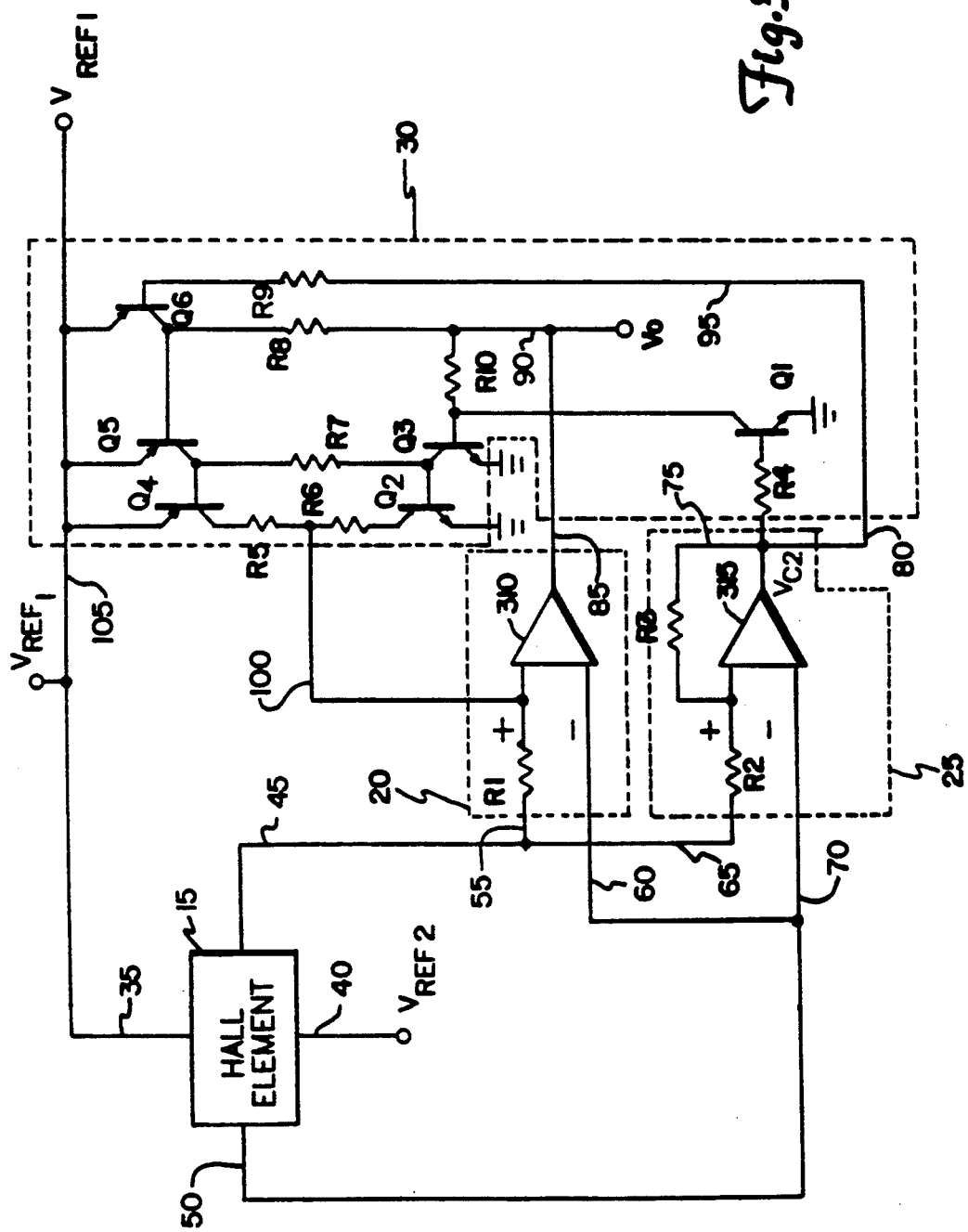
FIG. 3 is a schematic diagram of a preferred embodiment of the present invention.

Turning now to FIG. 3, thereshown is a schematic diagram of a preferred embodiment of the present invention. A Hall element 15 is connected across voltages $V_{REF1}$ and $V_{REF2}$ to bias the Hall element. Two output terminals from the Hall element are connected to first comparator circuit 20 and second comparator circuit 25. The output terminals of the two comparator circuits are then connected to a feedback circuit 30. The first and second comparator circuits and the feedback circuit will now be further described.

First voltage comparator circuit 20 comprises a first voltage comparator 310 and a resistor $R_1$. The first voltage comparator 310 has an inverting ($-$) and a noninverting ($+$) input terminal. The noninverting input terminal is directly connected to the output terminal 100 of feedback circuit 30. Hall element sense terminal 45 is connected to the noninverting terminal of first comparator 310 through resistor $R_1$. The inverting terminal of first comparator 310 is directly connected to Hall element sense terminal 50. The output voltage of first comparator 310 is also the output voltage of the entire system, $V_O$ which is found on output terminal 85.

Second voltage comparator means 25 includes second voltage comparator 315, resistor $R_2$ and resistor $R_3$. Second voltage comparator 315 also has noninverting and inverting input terminals. Hall element sense terminal 45 is electrically connected with the noninverting terminal of second voltage comparator 315 through resistor $R_2$. The output terminal of second voltage comparator 315 is connected to the noninverting terminal of the second voltage comparator 315 through resistor $R_3$. Lastly, the inverting terminal of second voltage comparator 315 is connected with Hall element sense terminal 50.

The feedback circuit 30 receives the output from first voltage comparator circuit 20 and second voltage comparator circuit 25 and produces a signal which causes first voltage comparator circuit to change from a low to high output at the same magnetic field intensity as a change from a high to a low level change, in effect making $B_{OP}=B_{RE}$. Feedback circuit 30 includes resistors $R_4$, $R_9$, $R_8$, $R_7$, $R_5$, $R_6$, and $R_{10}$, NPN transistors $Q_1$, $Q_2$, and $Q_3$, and PNP transistors $Q_6$, $Q_5$ and $Q_4$. The interrelationship of these parts will now be explained.

The output terminal 80 from second voltage comparator means 25 is connected to $R_4$ which in turn is connected to the base of $Q_1$. The emitter of $Q_1$ is tied to ground while the collector of $Q_1$ is connected to the base of transistor $Q_3$. The output of second voltage comparator means 25 is also connected to one end of $R_9$ which in turn is connected to the base of $Q_6$.

The output terminal of first voltage comparator circuit 20 is connected through $R_8$ to the collector of $Q_6$ and through $R_{10}$ to the base of $Q_3$.

The emitter of $Q_6$ is connected to DC power supply, $V_{REF1}$. The collector of $Q_6$ is also connected to the base of $Q_5$.

The emitter of $Q_5$ is also connected to $V_{REF1}$. The collector of $Q_5$ is connected to the base of $Q_4$.

The emitter of $Q_3$ is connected to ground, while the collector of $Q_3$ is connected to the base of $Q_2$. In addition, the collector of $Q_3$ is connected through $R_7$ to the collector of $Q_5$.

The emitter of $Q_4$ is also connected to $V_{REF1}$. The collector of $Q_4$ is then connected to one side of $R_5$. The other side of $R_5$ is connected to $R_6$. $R_6$ is connected to the collector of $Q_2$. The emitter of $Q_2$ is then connected to ground.

Feedback circuit 30 produces a high, mid level or low potential which depends upon the voltage inputs provided to the feedback circuit. The output terminal 100 of the feedback circuit 30 is the junction between $R_5$ and $R_6$.

The operation of the feedback circuit 30 will now be described. The feedback circuit receives as inputs, the output voltages of first and second comparator circuits $V_o$ and $V_{C2}$ respectively. There are four possible input combinations. These will each be discussed separately. In addition, it is important to keep in mind that the transistors used herein, both NPN and PNP types, are being operated as switches.

First is the situation where $V_o$ is low and $V_{C2}$ is low. $V_{C2}$ low results in $Q_1$ being off, and $Q_6$ being on. $Q_6$ being on in turn results in $Q_5$ being off. $V_o$ being low results in $Q_3$ being off. $Q_5$ being off means that $Q_4$ is on. $Q_3$ being off results in $Q_2$ being on. With $Q_2$ and $Q_4$ being on, $R_5$ is referenced to $V_{REF1}$ and $R_6$ is referenced to ground. Thus no current is sent through $R_1$ to the first voltage comparator 310, but instead the current through $R_5$ is sunk to ground.

The second situation is where $V_{C2}$ is low and $V_o$ is high. $V_{C2}$ being low results in $Q_1$ being off and $Q_6$ being on. $Q_6$ being on causes $Q_5$ to be off. $V_o$ being high and $Q_1$ being off results in $Q_3$ being on. $Q_5$ being off causes $Q_4$ to be on. $Q_3$ being on results in $Q_2$ being off. With $Q_4$ on and $Q_2$ off, $R_5$ is referenced from $V_{REF1}$ to the non-inverting node of the first voltage comparator 310. $R_6$ is effectively disconnected. This raises the voltage at the first voltage comparator 310 non-inverting terminal.

The third condition is where $V_{C2}$ is high and $V_o$ is high. $V_{C2}$ being high results in $Q_1$ being on and $Q_6$ being off. $Q_1$ being on causes $Q_3$ to be off. $V_o$ being high causes $Q_5$ to be off. $Q_3$ being off in turn causes $Q_2$ to be on. $Q_5$ being off results in $Q_4$ being on. As in the first situation $Q_2$ and $Q_4$ are on, causing the sinking of the current through $R_5$.

Lastly, there is the situation where $V_{C2}$ is high and $V_o$ is low. $V_{C2}$ high results in $Q_1$ being on and $Q_6$ being off. $Q_1$ being on causes $Q_3$ to be off. $V_o$ low and $Q_6$ off results in $Q_5$ being on. $Q_3$ off results in $Q_2$ being on. $Q_5$ being on causes $Q_4$ to be off. With $Q_2$ on and $Q_4$ off, $R_6$ is referenced from ground to the non-inverting terminal of first voltage comparator 310. $R_5$ is effectively disconnected. By referencing the non-inverting terminal to ground, the voltage of the non-inverting terminal is lowered.

The following is a chart showing the state of each of the transistors and the voltage level at the non-inverting terminal of first voltage comparator 310 for all combinations of $V_O$ and $V_{C2}$.

CHART 1

| | | | | |
|---|---|---|---|---|
| $V_{C2}$ | Low | Low | High | High |
| $V_0$ | Low | High | High | Low |
| $Q_6$ | ON | ON | OFF | OFF |
| $Q_5$ | OFF | OFF | OFF | ON |
| $Q_1$ | OFF | OFF | ON | ON |
| $Q_3$ | OFF | ON | OFF | OFF |
| $Q_2$ | ON | OFF | ON | ON |
| $Q_4$ | ON | ON | ON | OFF |
| Feedback | MID | HIGH | MID | LOW |

For the feedback circuit output, high means a voltage greater than $\frac{1}{2} V_{REF1}$, Low means a voltage less than $\frac{1}{2} V_{REF1}$, and mid means a voltage equal to $\frac{1}{2} V_{REF1}$.

The feedback circuit in concert with the voltage comparators produce a system wherein $B_{OP} = B_{RE}$. $R_5$ and $R_6$ can be used to supply feedback to the non-inverting input of first voltage comparator 310 to produce hysteresis. These resistors can also be used to shift both magnetic field trip points of first voltage comparator 310 by a magnitude of the differential ($V_{OP} - V_{RE}$). The hysteresis and shifting of the trip points is determined by the output conditions of first and second voltage comparators 310 and 315.

Figure 5A:
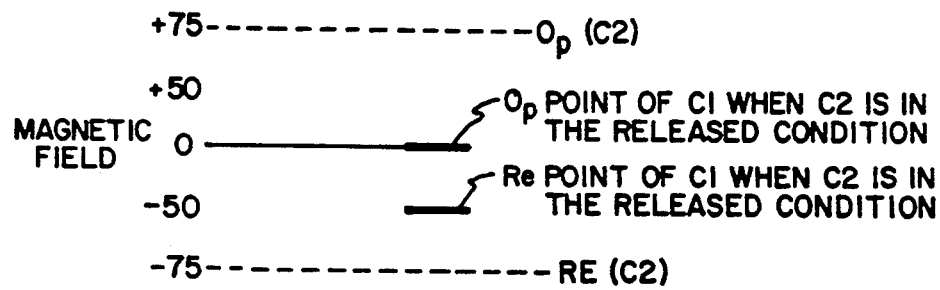
FIGS. 5a, b and c show the shifting of the operate and release points of the first comparator of the present system in response to the feedback signal.

The following explanation is more clearly understood with reference to FIGS. 5A, B and C. The $B_{OP}$ and $B_{RE}$ of the system when properly actuated are equal to each other. For example, let them both equal zero Gauss. But, first comparator 310 has two different trip points for example $B_{OP1} = 0$ Gauss while $B_{RE1} = -50$ Gauss, that get shifted by second comparator 315 having for example $B_{OP2} = 75$ Gauss and $B_{RE2} = -75$ Gauss.

When the system operates at $B_{OP}$, without the presence of second comparator 315, there are only two states at which first comparator 310 can exist. When first comparator 310 is in a first state, the only event which can then occur is that the first comparator 310 will switch to the second state. Thus, after a system including only first comparator 310 is operated, the only event which can then occur is the release of comparator 310. Without second comparator 315, this release point would be at a negative magnetic field intensity, $-50$ Gauss, in the present example.

In a sensing system which includes second comparator 315, there are more states at which first comparator 310 can exist. When second comparator 315 has a $B_{OP2} > B_{OP1}$ and $B_{RE2} < B_{RE1}$ as in the present example, and where both comparators are currently in the off state then the only next event which can occur is that first voltage comparator 310 is operated at a magnetic field intensity of zero Gauss. For the present system, it is important that the field intensity then continue to increase to $B_{OP2}$, in this case 75 Gauss. This will raise the release point of first voltage comparator 310 from in the present example, $-50$ Gauss to 0 Gauss because of the feedback provided by feedback circuit 30. Thus, when the magnetic field is now decreased, the system will "switch off" at zero Gauss, which is equal to the "switch-on" level.

| STEP | COMPARATOR 310 | COMPARATOR 315 | FEEDBACK CIRCUIT OUTPUT | $V_0$ |
| --- | --- | --- | --- | --- |
| 1 | Off | Off | Mid | Low |
| 2 | On | Off | High | High |
| 3 | On | On | Mid | High |
| 4 | Off | On | Low | Low |
| 5 | Off | Off | Mid | Low |

Figure 5B:
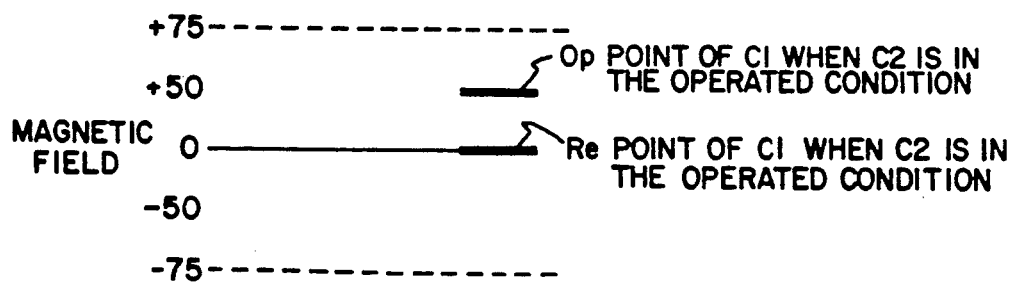
Figure 5C:
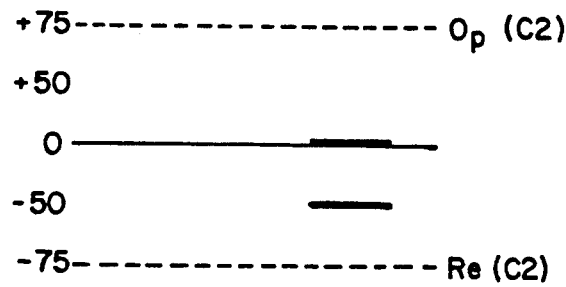

Once again, FIGS. 5A-C will aid in the understanding of the chart.

FIG. 5A shows the various operate and release points at step 1 in the chart.

At step 2, as shown in FIG. 5B, first voltage comparator 310 switches on. The condition just prior to the switch point for step number 2, of the feedback circuit is the previous condition at step 1, which is mid level potential. Right after switching at step 2, the condition for the feedback circuit output switches to a high potential output. This shows the hysteresis of first comparator 310 that forces clean switching of the output.

The next step 3 is when second comparator 315 turns on. This causes the feedback circuit output condition to switch back to a mid level potential.

Next, as shown in FIG. 5C, first comparator 310 turns off, and the previous step 3 condition is present at the feedback circuit output. This is the same as the previous condition of first comparator 310 where first comparator 310 switches from off to on (step 1 to step 2). The feedback circuit output condition at step 4 after switching is low. This also shows the hysteresis present for creating clean switching.

Step 5 switches second comparator 315 to the off state which returns the feedback circuit output to the mid condition. Thus the feedback circuit output is ready for the next transition of off to on of first comparator 310.

Thus, the condition of the feedback circuit output at each switch point ($B_{OP}$, $B_{RE}$) of first comparator 310 is mid level so that $B_{OP}$ equals $B_{RE}$ which for this example equals zero.

Figure 4A:
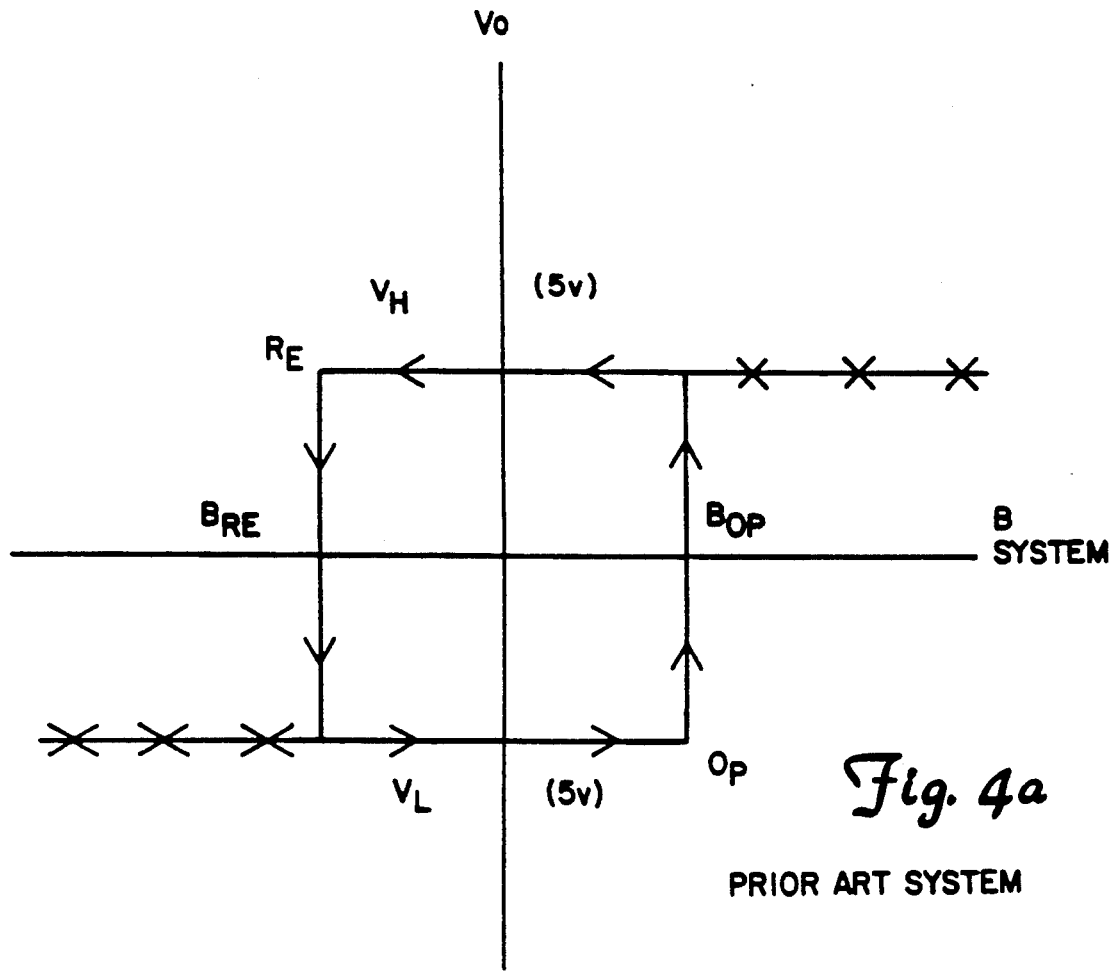
FIG. 4a is a plot of magnetic field intensity vs. sensing system output voltage for a prior art system.
Figure 4B:
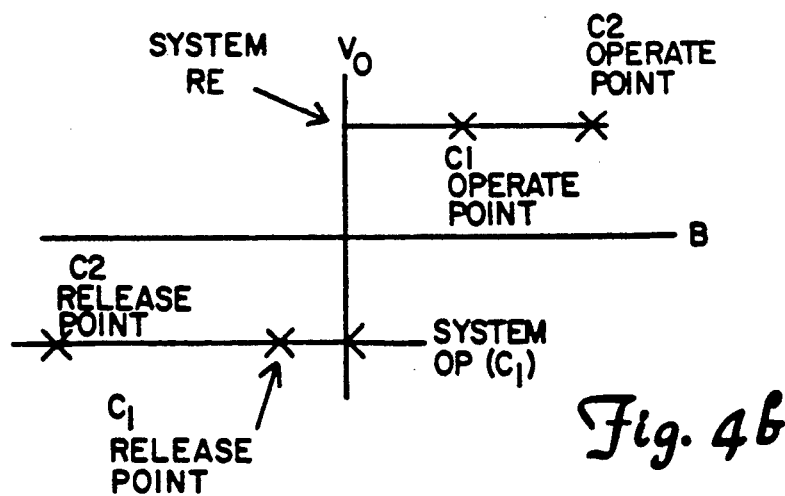
FIG. 4b is a plot of magnetic field intensity vs. sensing system output voltage for the present system.

A comparison of the switching points of a prior art system and the present system is shown in FIGS. 4A and 4B. The prior art system 4A shows hysteresis to a user while the present system shown in FIG. 4B shows no external hysteresis, even though internal hysteresis exists to provide clean switching.

While the foregoing has been a description of the inventor's preferred embodiment at the time of application, modifications will become obvious to one of ordinary skill in the art. The applicant does not intend to be limited to the embodiments described within the specification, but instead only to the claims appended hereto.

I claim:

1. A switching system, comprising:
an analog signal generator having first and second output terminals, said analog signal generator producing a variable analog signal in response to an external stimulus;
a first comparator means having a first input terminal connected to said first output terminal of said analog signal generator, a second input terminal connected to said second output terminal of said analog signal generator, a third input terminal and an output terminal, said first comparator means being operable to produce a two state output signal, which is also the system output, having high and low states;
a second comparator means having a first input terminal connected to said first output terminal of said analog signal generator, a second input terminal connected to said second output terminal of said analog signal generator and an output terminal, said second comparator means being operable to produce a two state output signal;
a feedback means having a first input terminal connected to the output terminal of said first comparator means, a second input terminal connected to the output terminal of said second comparator means, an output terminal connected to said third input terminal of said first comparator means said feedback means being operable to supply a three state feedback signal to said first comparator means, the feedback signal being of a state corresponding to the state of the output of said first comparator means if the outputs of said first and second comparator means are of different states, and being of a neutral state if the outputs of said first and second comparator means are of the same state, the system output being caused to switch between states at the same analog signal value for both increasing and decreasing external stimulus.

2. The apparatus of claim 1, wherein:
said analog signal generator is a Hall element.

3. A method for producing a substantially hysteresis free binary output signal indicative of whether an analog signal is greater or less than a predetermined value, comprising the steps of:
supplying the analog signal to first and second comparators which respectively produce first and second binary comparator output signals representative of the value of the analog signal, the comparator output signals generally having hysteresis whereby said output signals each change state at different analog signal values depending on the sense of change of said analog signal;
generating a tri-state signal in response to the first and second comparator output signals, the tri-state signal having a value of the same sense as the first comparator output signal if the first and second comparator output signals are of opposite senses, and having a neutral sense if the first and second comparator output signals are of the same sense;
modifying the analog signal supplied to the first comparator in accordance with the tri-state signal; and
supplying the first comparator output signal as the substantially hysteresis free binary output signal.

4. A sensing system, comprising:
a Hall element having first and second sense terminals, said Hall element operable to produce a variable voltage between said sense terminals when affected by a variable magnetic field;
a first voltage comparator circuit having a first input terminal electrically connected to said first sense terminal, a second input terminal electrically connected to said second sense terminal, a third input terminal and an output terminal, said first voltage comparator circuit being operable to produce a digital output, which is also the system output, having high and low states;
a second voltage comparator circuit having a first input terminal electrically connected to said first sense terminal, a second input terminal electrically connected to said second sense terminal and an output terminal, said second voltage comparator being operable to produce a digital output having high and low states; and a feedback circuit having a first input terminal electrically connected to the output terminal of said first comparator circuit, a second input terminal electrically connected to the output terminal of said second comparator circuit and an output terminal connected to said third input terminal of said first comparator circuit, said feedback circuit being operable to supply a three-state feedback signal to said first comparator circuit, the feedback signal being of a state corresponding to the state of digital output of said first comparator circuit if the digital outputs of said first and second comparator circuits are of different states, and being of a neutral state if the digital outputs of said first and second comparator circuits are of the same state, the system output being caused to switch between states at the same field intensity at the Hall element for both increasing and decreasing magnetic field intensities.

5. The sensing system of claim 4, wherein said feedback circuit comprises:

first and second controllable variable impedance means each having an input and an output port, said output ports being electrically connected and forming the output terminal of said feedback circuit; and a logic circuit in communication with said first and second voltage comparator circuits and having output terminals electrically connected to said input terminals of said first and second controllable variable impedance means, said logic circuit being operable to cause a high voltage at said output terminal of said feedback circuit if said output of said first voltage comparator is high while said output of said second voltage comparator is low, a low output at said output terminal of said feedback circuit if said digital output of said first voltage comparator is low while said output of said second voltage comparator is high, and a midlevel voltage output at said output terminal of said feedback circuit if said outputs of said first and second voltage comparators are equal.

6. The sensing system of claim 5, wherein:

said first voltage comparator circuit comprises a voltage comparator having inverting and non-inverting input ports and an output port and a resistor having first and second terminals, said second terminal being electrically connected to the non-inverting input port, said first input terminal being formed by said first terminal, said second input terminal being the same as said inverting input port, said third input terminal being formed by the junction of resistor and said non-inverting input port; and said second voltage comparator circuit comprises a voltage comparator having inverting and non-inverting input ports and an output port, and first and second resistors each having first and second terminals, said first resistor being electrically connected between said output port and said non-inverting input port, said first terminal of said second resistor being electrically connected to said non-inverting input port, said second terminal forming the first input terminal of said second voltage comparator circuit, said inverting input port forming said second input terminal of said second voltage comparator circuit.

7. The sensing system of claim 6, wherein:

said first and second controllable variable impedance means have the same impedance value.

8. An improved proximity sensing apparatus for producing a digital output including a Hall element having two sensing terminals, a first voltage comparator circuit having first, second and third input terminals and an output terminal where the first and second input terminals are electrically connected across the sensing terminals of the Hall element, the improvement comprising:

a second voltage comparator having first and second input terminals electrically connected across the sensing terminals of the Hall element and an output terminal; and a feedback circuit having a first input terminal electrically connected to the output terminal of the first voltage comparator circuit and a second input terminal electrically connected to said output terminal of said second voltage comparator circuit, said feedback circuit further having an output terminal electrically connected to the third input terminal of the first voltage comparator circuit, said feedback circuit being operable to supply a three-state feedback signal to said first voltage comparator circuit, the feedback signal being of a state corresponding to the state of digital output of said first voltage comparator circuit if the digital outputs of said first and second voltage comparator circuits are of different states, and being of a neutral state if the digital outputs of said first and second comparator circuits are of the same state, whereby the system output has caused the switch between the states at the same field intensity at the Hall element for both increasing and decreasing magnetic field intensities.

* * * * *

UNITED STATES PATENT AND TRADEMARK OFFICE
CERTIFICATE OF CORRECTION

PATENT NO. : 5,166,548

DATED : NOVEMBER 24, 1992

INVENTOR(S) : RICHARD W. NELSON

It is certified that error appears in the above-identified patent and that said Letters Patent is hereby corrected as shown below:

On the title page, after item [76] Inventor:

Add Assignee: Honeywell Inc., Minneapolis, MN

Signed and Sealed this

Thirtieth Day of November, 1993

Attest:

BRUCE LEHMAN

Attesting Officer

Commissioner of Patents and Trademarks